United States Patent [19]

Kimura et al.

[11] Patent Number: 4,646,122

[45] Date of Patent: Feb. 24, 1987

[54] SEMICONDUCTOR DEVICE WITH FLOATING REMOTE GATE TURN-OFF MEANS

[75] Inventors: Shin Kimura; Hiroshi Fukui; Hisao Amano; Tsutomu Yatsuo; Saburo Oikawa; Takahiro Nagano, all of Hitachi, Japan

[73] Assignee: Hitachi, Ltd., Tokyo, Japan

[21] Appl. No.: 585,606

[22] Filed: Mar. 2, 1984

[30] Foreign Application Priority Data

Mar. 11, 1983 [JP] Japan .................................. 58-39001
Apr. 11, 1983 [JP] Japan .................................. 58-64103

[51] Int. Cl.$^4$ ............................................. H01L 29/74
[52] U.S. Cl. ........................................ 357/38; 357/20; 357/36; 357/86
[58] Field of Search ........................ 357/20, 38, 86, 36

[56] References Cited

U.S. PATENT DOCUMENTS

| | | | |
|---|---|---|---|
| 3,097,335 | 7/1963 | Schmidt | 357/38 |
| 3,124,703 | 3/1964 | Sylvan | 357/38 |
| 3,271,587 | 9/1966 | Schreiner | 357/38 |
| 3,277,310 | 10/1966 | Schreiner | 357/38 |
| 3,300,694 | 1/1967 | Stehney et al. | 357/38 |
| 3,486,088 | 12/1969 | Gray et al. | 357/38 |
| 4,170,020 | 10/1979 | Sueoka et al. | 357/38 |
| 4,315,274 | 2/1982 | Fukui et al. | 357/38 |
| 4,325,074 | 4/1982 | Osada et al. | 357/38 |
| 4,345,266 | 8/1982 | Owyang | 357/38 |
| 4,491,742 | 1/1985 | Akamatsu | 357/38 |

FOREIGN PATENT DOCUMENTS 57-78172 5/1982 Japan ................................ 357/38 G Primary Examiner—Joseph E. Clawson, Jr.
Attorney, Agent, or Firm—Antonelli, Terry & Wands

[57] ABSTRACT

A semiconductor device such as a transistor or gate turn-off thyristor provided with a control electrode for improving the current cut-off performance, is disclosed in which an emitter layer of a semiconductor substrate is formed of a plurality of strip-shaped regions, a base layer adjacent to the strip-shaped regions is exposed to one principal surface of the semiconductor substrate together with the strip-shaped regions, one main electrode is provided on each strip-shaped region, first and second control electrodes are provided on the base layer, on one and the other sides of each strip-shaped region viewed in the direction of the width thereof, respectively, the other main electrode is provided on the second principal surface of the semiconductor substrate, and a gate terminal is not connected to the first control electrode but connected to the second control electrode, in order to draw out carriers unequally by the first and second control electrodes at a turn-off period. At the initial stage of turn-off action, carriers are drawn out mainly by the second control terminal, and a conductive region contracts so as to be limited to the first control electrode side. At the final stage of turn-off action, carriers are drawn out considerably by the first control electrode, to complete the turn-off action.

7 Claims, 20 Drawing Figures

SEMICONDUCTOR DEVICE WITH FLOATING REMOTE GATE TURN-OFF MEANS

The present invention relates to a semiconductor device whose main current can be cut off by a control signal, such as a gate turn-off thyristor or a transistor capable of being turned off by a control current, and more particularly to the structure of control electrode for improving the current cut-off performance of the semiconductor device.

Vertical semiconductor devices which allow a main current to flow across the thickness of a substrate are well suited for high power devices.

A gate turn-off thyristor (hereinafter simply referred to as "GTO") or a transistor (hereinafter simply referred to as "TRS") of vertical type usually has the following structure. An emitter layer is formed of a plurality of strip-shaped regions, disposed in a base layer, and is exposed to one principal surface of a semiconductor substrate, together with the base layer adjacent to the emitter layer. Each strip-shaped emitter region can be well controlled by the base region and a large number of such regions can provide a large current. One main electrode may be formed on and in ohmic contact with each of the strip-shaped emitter regions, and a control electrode is formed on and in ohmic contact with the base region in such a manner that each strip-shaped emitter region is substantially surrounded by the control electrode. Further, the other main electrode is formed on and in ohmic contact with the other principal surface of the semiconductor substrate (refer to a Japanese Patent Application Laid-open No. 78173/1982). The emitter and the base electrodes may also be interdigitated.

Now, a GTO will be explained below in detail, by way of example. Referring to FIG. 1a, reference numeral 1 designates a silicon substrate capable of performing a gate turn-off thyristor action, 2 a cathode electrode, 3 a gate electrode, 4 an anode electrode, 5 a cathode terminal, 6 a gate terminal, and 7 an anode terminal. The electrodes 2, 3 and 4 act as inner conductors, and the terminals 5, 6 and 7 are provided outside a package (not shown), to be connected to an external circuit. The silicon substrate 1 includes four layers between its upper and lower principal surfaces in such a manner that adjacent ones of the four layers are different in conductivity type from each other, that is, includes a p-emitter layer 1a, an n-base layer 1b, a p-base layer 1c and an n-emitter layer 1d as shown in FIG. 1b. The p-base layer 1c and n-emitter layer 1d are exposed to the upper principal surface. The n-emitter layer is divided into a plurality of regions, each of which is long and narrow. In other words, each of the n-emitter regions has the form of a strip. These strip-shaped n-emitter regions are juxtaposed in the upper principal surface of the silicon substrate so that their lengthwise orientations are parallel to each other. Each of the n-emitter regions 1d is surrounded by the p-base layer 1c. A silicon oxide film (not shown) is provided, as a surface passivation film, on the upper principal surface. The cathode electrodes 2 and the gate electrodes 3 are kept in ohmic contact with the n-emitter regions 1d and the p-base layer 1c, respectively, through apertures which are provided in the silicon oxide film. A pair of gate electrodes 3 are disposed on both sides of each n-emitter region 1d so that each n-emitter region is substantially surrounded by the gate electrodes. The GTO has the above-mentioned structure, because the turn-off action in the GTO can be considered in the following way. When a current is drawn out from the gate electrode of the GTO which has been put in a conductive state, to interrupt the main current of the GTO, that is, to turn off the GTO, the active region which has been conductive to allow the main current to flow therethrough gradually changes into a turned-off state from the gate electrode side, under each n-emitter region, to leave a central portion of the n-emitter region 1d still active. That portion of the p-base layer 1c which exists beneath the n-emitter layer 1d and has been changed into the turned-off state, has no excess carriers, and therefore the resistance of that portion has a value equivalent to that at the thermal equilibrium. Accordingly, a current flowing through the turned-off portion in a lateral direction causes a voltage drop. As a result, a current drawn out from the conductive (active) region which has not yet been turned off, decreases in proportion to the difference between the gate voltage supplied from a gate power source for the turn-off action and the above-mentioned voltage drop developed laterally in the p-base layer 1c across the thermal equilibrium resistance. That is, as the turn-off action proceeds, the width of the conductive region becomes narrow, and the efficiency of drawing current out from the conductive region is decreased. When the width of the n-emitter layer 1d is so large that the supply voltage of the gate power source for turn-off action becomes nearly equal to the voltage drop developed laterally in the p-base layer 1c, the turn-off action proceeds no further, and a current flows through a narrow conductive region which is not yet turned off, that is, the current is concentrated to the narrow region. As a result, the temperature rise in this region due to power loss becomes very large, and the temperature of the region may finally be increased to the so-called intrinsic temperature (about 500° C.) at which the conductivity type cannot be distinguished. Thus, the current flowing through the region is abruptly increased, and thermal destruction occurs. Thus, failure of turn-off action will lead to the destruction of the device. In order to dodge the above question, it is required to make the width of each n-emitter region 1d sufficiently small to prevent an excessive increase of the voltage drop developed in a lateral direction across that portion of the p-base layer 1c which exists beneath each n-emitter region 1d, in other words, to allow the effect of the driving force for the turn-off action to reach the central portion of the n-emitter region 1d. For this reason, in a conventional GTO, each n-emitter region 1d is made long and narrow, that is, has the form of a strip, and the gate electrode 3 is provided in close proximity to the n-emitter region 1d.

According to the conventional GTO technique, however, a limit is placed on the current cut-off performance (namely, the turn-off performance) of a GTO. Prior to explaining the above limit, a measure for indicating the turn-off capability of a GTO will be described below.

The present inventors have studied the turn-off destruction phenomenon and have found the following facts. Namely, a GTO can be safely turned off as long as the locus of the operating point indicating an anode-cathode voltage and an anode current at every instance does not exceed a limiting line. The locus is obtained by plotting the instantaneous value of anode-cathode voltage and the instantaneous value of anode current observed in turning off a GTO as abscissa and ordinate, respectively, that is, a voltage versus current curve at the turn-off period. The limiting line is determined by the junction structure of the GTO.

FIG. 2 shows examples of the limiting line L. When a curve indicating the voltage versus current characteristic in a turn-off period does not exceed a limiting line $L_1$, a GTO can be safely turned off. Accordingly, an area defined by the limiting line and coordinate axes is called a safety operating area (hereinafter simply referred to as "SOA"). In other words, the turn-off capability of a GTO is determined by the SOA thereof. Of the factors defining the SOA, the anode current plotted as ordinate varies with the number of strip-shaped n-emitter regions and the length of each n-emitter region (it is not possible to freely change the width of each n-emitter region $1d$, as mentioned previously). That is, the anode current can be varied by changing the size of the silicon substrate. In order to compare the turn-off capability of a GTO with that of a different GTO, not the absolute value of anode current but the current density which is obtained by dividing the above absolute value by the total area of the n-emitter layers, is represented by the ordinate in FIG. 2. When a GTO having such an SOA as defined by the limiting line $L_1$ is operated under such circuit condition that a voltage versus current curve will be represented by $l_1$, the operating curve $l_1$ of the GTO exceeds the SOA at a point A, and thus the GTO will be destroyed. The anode-cathode voltage at which the GTO will be destroyed, is referred to as a "critical voltage" in this specification. Then, the above GTO can be said to have a low critical voltage. In the case where a GTO having a low critical voltage is used, a circuit including the GTO is required to be designed so that the voltage between the anode and the cathode of the GTO is not a large value.

FIG. 3 shows a protection circuit which is generally used for a conventional GTO and is called a snubber circuit. The snubber circuit is connected between the anode terminal 7 and cathode terminal 5 which are external terminals of the GTO, and is made up of a diode D, a resistor R and a capacitor C. As a process of drawing a current through the gate terminal 6 from the GTO which has been in a conductive state proceeds, the internal impedance of the GTO becomes large. Here, if the GTO and snubber circuit are connected in parallel, a current flows into the capacitor C through the diode D to charge the capacitor C. At this time, the voltage applied between both ends of the snubber circuit, that is, the voltage applied between the anode and cathode of the GTO is low, since the voltage developed across the diode D is as low as about 1 V. A voltage versus current characteristic of the GTO which is obtained when the snubber circuit is connected in parallel to the GTO, is indicated by a curve $l_2$ in FIG. 2. Since the curve $l_2$ exists within the limiting line $L_1$, the GTO can perform a turn-off operation without being destroyed. The capacitor C discharges through the resistor R in a period when the GTO is turned on, and thus the voltage appearing across the capacitor C is made equal to zero before the GTO is to be turned off. In other words, the energy which is stored in the capacitor C, is dissipated in the resistor R. As mentioned above, when the snubber circuit is connected to the GTO, there arises a problem that a circuit for the GTO becomes complicated and power loss is increased.

When a GTO has such a wide SOA as given by a limiting line $L_2$ and the curve $l_2$ lies within this SOA, the GTO can be safely turned off even if the snubber circuit is not used. Accordingly, it can be said that such a GTO is large in current cut-off capability. As described in a Japanese Patent Application Specification (Publication No. 28750/1968), in order to improve the current cut-off capability of a GTO, it has been proposed to remove a central portion of the n-emitter layer. In this case, however, there arises a problem that the ON-voltage of the GTO in a conductive state is high, since the effective area of the n-emitter layer is reduced.

Further, as described in a Japanese Patent Application Specification (Laid-open No. 78172/1982), it has been proposed to make a central portion of the n-emitter layer smaller in thickness than a peripheral portion of the n-emitter layer and to form an impurity concentration peak at a predetermined position in the p-base layer so that the peak value is higher than the surface impurity concentration at that inner portion of the p-base layer which is adjacent to the n-emitter layer in a bulk region. In this case, however, the carrier density in a conductive state becomes smaller, as compared with the corresponding carrier density of the GTO shown in FIGS. 1a and 1b, and thus there arises a problem that the ON-voltage is high. Further, there arises another problem that the manufacturing process of the GTO is complicated.

The above-mentioned problems also arise in a TRS.

An object of the present invention is to provide a semiconductor device which has a wide SOA, and in which the ON-voltage in a conductive state is low.

Another object of the present invention is to provide a semiconductor device which has a wide SOA, and can dispense with a protection circuit such as a snubber circuit or can use a small-capacity protection circuit, if used.

A further object of the present invention is to provide a semiconductor device which has a wide SOA without necessitating a complicated manufacturing process.

In order to attain the above objects, according to the present invention, there is provided a semiconductor device having a structure that a semiconductor substrate for forming a main part of the semiconductor device includes at least three semiconductor layers, adjacent ones of the semiconductor layers are different in conductivity type from each other, a first one of the semiconductor layers is formed of at least one strip-shaped region, a second one of the semiconductor layers is exposed to a first principal surface of the semiconductor substrate together with the strip-shaped region, a first main electrode is connected with the strip-shaped region at the first principal surface, a control electrode is connected with the second semiconductor layer at the first principal surface, and a second main electrode is connected with a semiconductor layer disposed on the second principal surface side of the semiconductor substrate; which semiconductor device comprises first means for concentrating a conductive region where a current can flow through the semiconductor substrate, to a portion which is limited to one side of the strip-shaped region in the direction of the width of the strip-shaped region, when a main current flowing between the first main electrode and second main electrode is to be cut off by a control current flowing between the gate electrode and first main electrode, and second means provided in close proximity to the above portion of the concentrated current, for efficiently drawing a current from the conductive region.

The present invention will be apparent from the following detailed description taken in conjunction with the accompanying drawings, in which:

FIG. 1b is a vertical sectional view taken along the line Ib—Ib of FIG. 1a;

FIG. 9b is a fragmentary vertical sectional view taken along the line IXb—IXb of FIG. 9a;

FIG. 13b is a fragmentary sectional view taken along the line XIIIb—XIIIb of FIG. 13a;

Now, description will be made on preferred embodiments of the invention.

Figure 4:
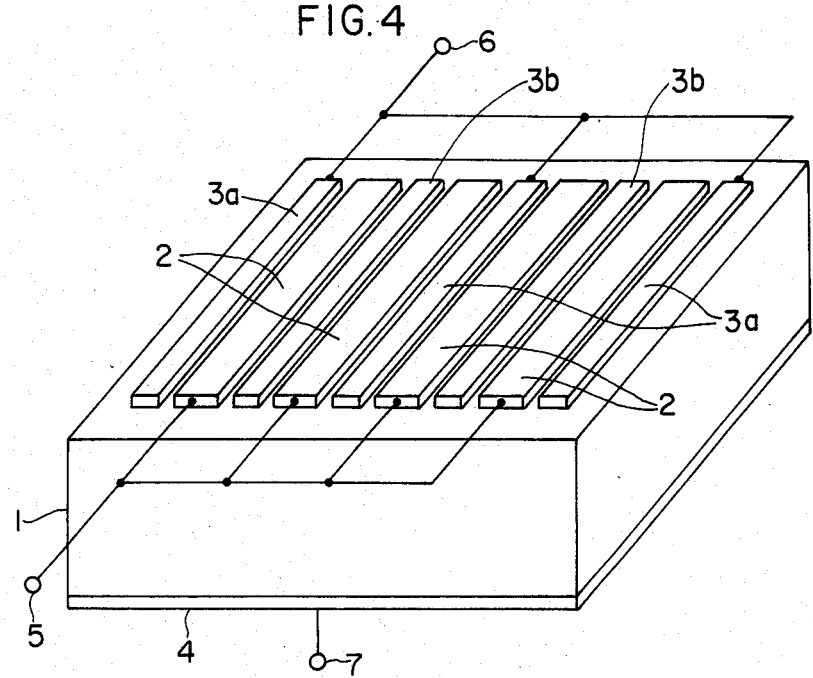
FIG. 4 is a schematic perspective view showing a GTO according to the present invention.

FIG. 4 shows the outline of a GTO according to the present invention. In FIG. 4, the same reference numerals as in FIG. 1 designate identical or equivalent parts.

Figure 1A:
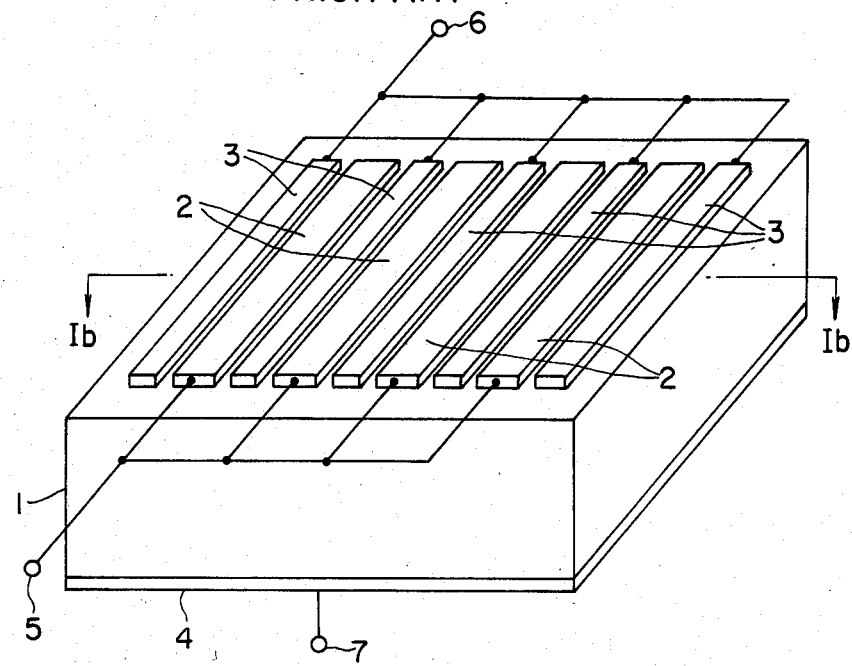
FIG. 1a is a schematic perspective view showing a conventional GTO.
Figure 1B:
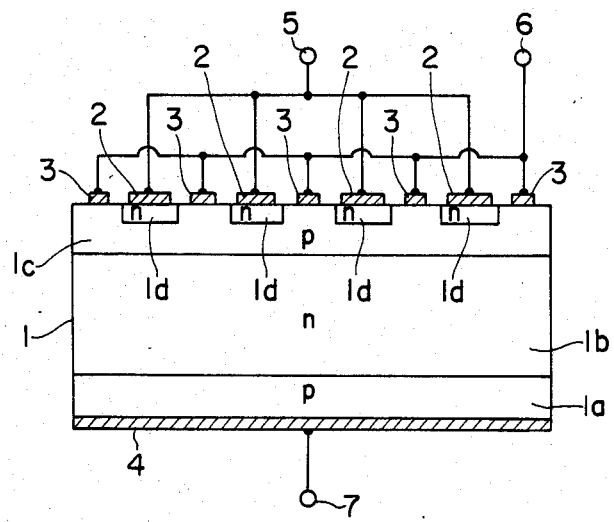
Figure 2:
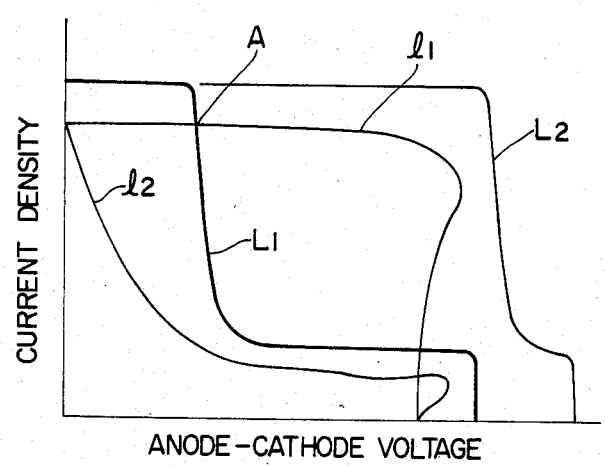
FIG. 2 is a graph showing relations between the anode-cathode voltage and current density of GTO.
Figure 3:
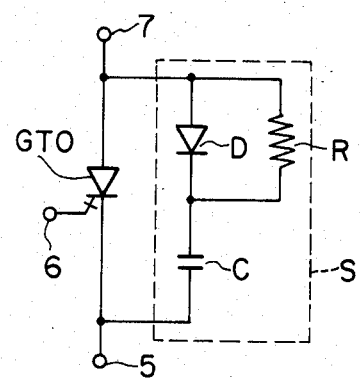
FIG. 3 is a circuit diagram showing the combination of a GTO with a protection circuit.

The GTO shown in FIG. 4 is most significantly different from that shown in FIG. 1 in that the gate electrodes 3 are classified as gate electrodes 3a and gate electrodes 3b, the gate electrode 3a and gate electrode 3b are alternately arranged, and only the gate electrodes 3a are connected directly with the external gate terminal 6.

In a preferred example, the width $X_{nE}$ and the length $L_{nE}$ of each n-emitter region 1d were 300 μm and 6300 μm=6.3 mm, respectively. The sheet resistivity $\rho_{s1}$ of the p-base layer where no n-emitter layer exists was 20 $\Omega/\square$ and the sheet resistivity $\rho_{spB}$ of the p-base layer beneath the n-emitter region was 65 $\Omega/\square$. It is preferred to select $X_{nE}$ from 100 to 500 μm, $L_{nE}$ from 2 to 10 mm, $\rho_{s1}$ from 10 to 50 $\Omega/\square$ and $\rho_{spB}$ from 50 to 200 $\Omega/\square$.

It will be apparent that the length $L_{nE}$ is longer than the width $X_{nE}$. Further it is preferred that the ratio $L_{nE}/X_{nE}$ is not smaller than 10 for deriving a large current. Here, it may also be noted that the metal electrodes 3a and 3b have a resistivity of the order of $10^{-6}$ $\Omega.cm$ and a thickness of the order of about $10^{-4}$ cm, and hence a sheet resistivity of the order of $10^{-2} \Omega/\square$. Thus, the electrode resistance can be neglected in comparison to the semiconductor resistance. Then, the gate electrodes 3a can be considered to be directly connected to the gate power source while the floating gate electrodes 3b can be considered to be connected to the gate power source through a parallel connection of a constant resistance $R_{gg}$ ascribed to the portion of p-base region surrounding the active current path portion and a variable resistance $R_B$ ascribed to the current path portion of p-base region beneath the n-emitter region. The resistance $R_B$ takes a certain fixed value $R_{B0}$ in the thermal equilibrium (OFF) state and a variable value $r_3$ in the conducting (ON) and transient state, which is larger than $R_{B0}$. The resistance $r_3$ is mainly determined by the ratio of the area having been turned off to the total area of the active current path portion.

When a current flows through the floating gate and hence the parallel connection of the resistances $R_{gg}$ and $R_B$ ($r_3$), there is established a voltage drop across the hybrid resistance ($R_g$ and $r_3$), leading to an unbalanced control function of the connected gate electrode 3a and the floating gate electrode 3b. Namely, the connected gate electrode 3a forcedly derives the main current to the gate terminal to reduce the current concentration in the current path region near the connected gate 3a in an initial period. As the turn-off action proceeds, the variable resistance $r_3$ becomes small and the floating gate 3b becomes effective to derive the main current. For example, in a thermal equilibrium state, a central spot in the current path portion of the p-base region is connected to the gate electrodes on both side by resistances of, e.g. 60 $\Omega$ each, and a side spot therein near the gate electrode 3b is connected to the gate electrode 3a through a resistance of, e.g. 100 $\Omega$, and to the gate electrode 3b through a resistance of, e.g. 3 $\Omega$. The structure of FIG. 4 can shift the final turning-off position from the central spot to the side spot. Then, the final turning-off point can be connected to the gate power source through a reduced resistance and can be more stably controlled.

Figure 5:
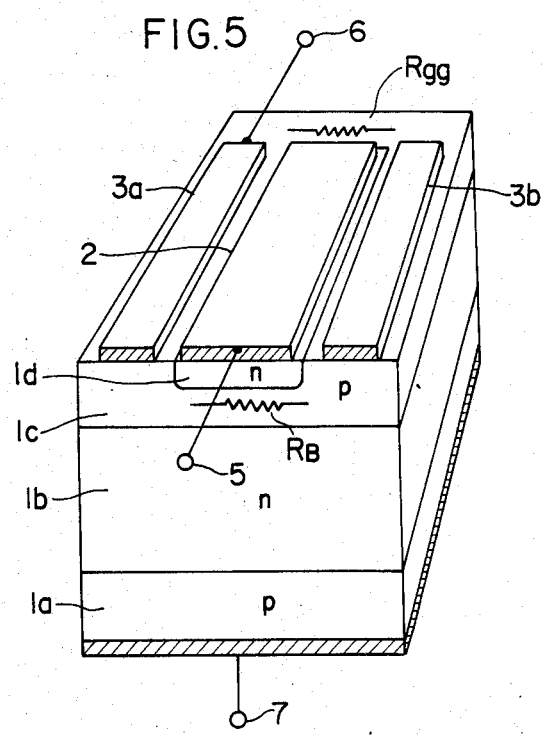
FIG. 5 is a fragmentary perspective view, partly cross-sectional, of the GTO shown in FIG. 4.

Next, explanation will be made on the operation of the GTO shown in FIG. 4. The GTO of FIG. 4 is considered to be formed by combining a plurality of unit GTO structures, as shown in FIG. 5, in parallel. Accordingly, the unit GTO structure shown in FIG. 5 will be explained below.

Referring to FIG. 5, the gate electrodes 3a and 3b are electrically connected to each other through that portion of the p-base layer 1c which is located around or outside of the projection of n-emitter region 1d. The resistance of the above portion is herein referred to as "inter-gate resistance" and expressed by $R_{gg}$. Further, it is to be noted that, in a thermal equilibrium state, the gate electrode 3a is connected to the gate electrode 3b through the parallel combination of the above-mentioned inter-gate resistance $R_{gg}$ and the resistance $R_B$ of that portion of the p-base layer 1c which is located beneath the n-emitter layer 1d.

In a stationary ON-state, a main current flows through the whole area of the n-emitter layer 1d, that is, a conductive region is spread over the whole area of the n-emitter region 1d (and the portion of the p-base layer therebeneath). In this state, a current is to be drawn out through the gate terminal 6, to turn off the GTO. At this time, the resistance between the gate electrodes 3a and 3b is considered to be equal to the inter-gate resistance $R_{gg}$, since there would be no current flow through the resistance $R_B$ in the ON-state. The thermal equilibrium resistance $R_B$ itself cannot be defined in the ON-state. Accordingly, the drawn-out current scarcely flows from the gate electrode (3b) side, that is, the turn-off action proceeds only from the gate electrode (3a) side. As a result, a current concentration region is limited to the gate electrode (3b) side. The turn-off action proceeds not only in the direction of the width of the n-emitter region 1d but also in the lengthwise direction thereof. However, since the length $L_{nE}$ of the n-emitter region 1d is far larger than the width $X_{nE}$ thereof, it is considered that a conductive region substantially begins to contract in the direction of the lengthwise direction of the n-emitter region after having contracted sufficiently in the direction of the width of the n-emitter region. In a period when the conductive region contracts in the direction of the above-mentioned width, the conductive region contracts so as to remain on the gate electrode (3b) side due to the existence of the inter-gate resist $R_{gg}$. When the conductive region begins to contract in the above-mentioned lengthwise direction, the resistance between the gate electrodes 3a and 3b begins to decrease from the inter-gate resistance $R_{gg}$ for the following reason. That portion of the p-base layer 1c which exists beneath the n-emitter region 1d and has been turned off, returns substantially into a thermal equilibrium state, and a resistive current path is recovered in the turned-off portion. The resistance of the recovered current path is connected in parallel to the resistance $R_{gg}$. However, the sheet resistivity $\rho_{SPB}$ of that portion of the p-base layer 1c which exists beneath the n-emitter layer 1d, is several times higher than the sheet resistivity $\rho_{SL}$ of that portion of the p-base layer which exists on the outside of the periphery of the n-emitter layer, and therefore the effective resistance between the gate electrodes 3a and 3b is not reduced till the conductive region contracts to a considered degree in the lengthwise direction of the n-emitter layer. When the conductive region contracts to a small spot at the final stage of the turn-off action, the resistance between the gate electrodes 3a and 3b becomes nearly equal to the parallel combination of the resistance $R_{gg}$ and the resistance $R_B$ (having a small value), and thus the current can be effectively drawn out from the gate electrode (3b) side.

The above-mentioned turn-off action can be summarized as follows. At the initial stage of the turn-off action, owing to the difference in turn-off current between one and the other sides of the n-emitter layer in the direction of the width thereof, carriers are drawn out unequally from one and the other sides. At the final stage of the turn-off action, the conductive region is limited to one side, and carriers in such biased conductive region are drawn out from both sides.

Next, explanation will be made of the reason why the GTO capable of performing the above turn-off action has a wide SOA.

Figure 6:
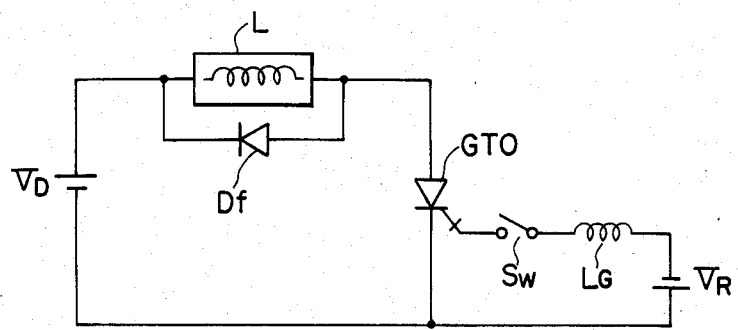
FIG. 6 is a circuit diagram showing the outline of a circuit connected to a GTO.

FIG. 6 shows an example of a circuit connected to a GTO. In such a circuit, a free wheel diode $D_f$ is usually connected between both ends of an inductive load L, to prevent the anode-cathode voltage of the GTO from exceeding the supply voltage $V_D$ of a power source. Further, a gate circuit for turn-off action is made up of a switch $S_W$, an inductance $L_G$ and a gate power source whose supply voltage $V_R$ is lower than the avalanche voltage $V_{av}$ developed between the gate and cathode of the GTO.

Figure 7:
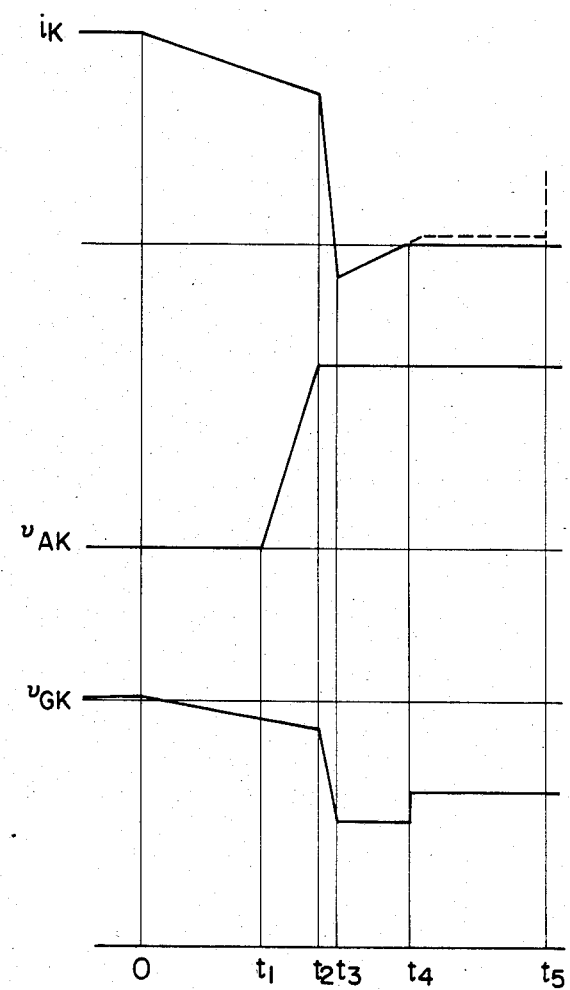
FIG. 7 is a graph showing current and voltage waveforms of a GTO at a turn-off period.

FIG. 7 is a graph roughly showing the waveforms of cathode current $i_K$, anode-cathode voltage $v_{AK}$ and gate-cathode voltage $v_{GK}$ at a turn-off period. Referring to FIG. 7, the switch $S_W$ shown in FIG. 6 is closed at a time $t=0$. Then, a gate current $i_G$ begins to flow, and increases at a rate of $V_R/L_G$, since the gate-cathode resistance of the GTO is approximately equal to zero at this time. The cathode current $i_K$ is obtained by subtracting the gate current $i_G$ from an anode current $i_A$. The anode current $i_A$ is kept constant till the anode-cathode voltage $v_{AK}$ is increased to the supply voltage $V_D$. Accordingly, the cathode current $i_K$ decreases at a constant rate. The anode-cathode voltage $v_{AK}$ begins to increase at a time $t_1$, because the internal resistance of the GTO has increased to such an extent as to be comparable to the resistance of the load L. As a process of drawing out a current from the gate electrode proceeds, the internal resistance of the GTO is further increased. As a result, the anode-cathode voltage $v_{AK}$ is increased, and finally reaches the supply voltage $V_D$ at a time $t_2$. Then, the energy stored in the inductance of the load L is extinguished through the free-wheel diode $D_f$, and therefore the anode current $i_A$ is decreased. As a result, the cathode current $i_K$ is also decreased. When the anode current $i_A$ becomes smaller than the gate current $i_G$, the cathode current $i_K$ takes a negative value. The PN junction formed between the n-emitter layer and p-base layer (hereinafter simply referred to as "$J_3$ junction") is recovered to a reverse bias blocking state (reverse recovery), at a time $t_3$, and the gate-cathode voltage $v_{GK}$ is made as high as the avalanche voltage $V_{av}$ developed between the gate and cathode, by the energy stored in the inductance $L_G$. Such an avalanche period (between the time $t_3$ and time $t_4$) terminates when the energy of the inductance $L_G$ is extinguished. In this period, the cathode current flows in the reverse direction.

The period between the time $t=0$ and time $t_1$ will be referred to as "storage period", the period between the time $t_1$ and time $t_3$ as "fall period", and the period after that time $t_3$ as "tail period". The present inventors have measured the limit of SOA, that is, a critical voltage, while carefully observing the previously-mentioned waveforms. As the result of measurement, the following facts have been found. The failure of turn-off operation always occurs at a later stage of the tail period, and a premonition of turn-off failure appears at and continues from an initial stage of the tail period. Further, when a turn-off operation fails, a GTO is destroyed but the damaged region of the GTO is limited to a very small area of the n-emitter layer (having a dimension of about 100 μm). A broken-line portion of the cathode current $i_K$ shown in FIG. 7 indicates a cathode current which is produced when the turn-off failure occurs. That is, the cathode current $i_K$ again takes a positive value in the tail period, and this state is maintained for a period (between a time $t_4$ and a time $t_5$) Then, the cathode current is abruptly increased, and thus the GTO is destroyed.

Figure 8:
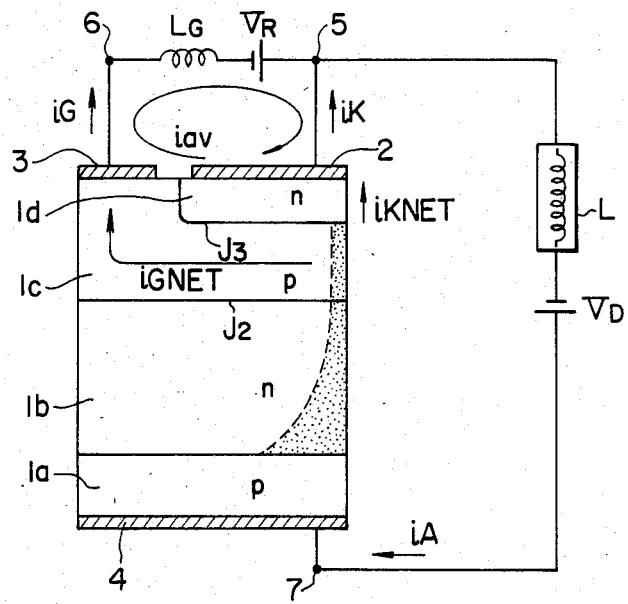
FIG. 8 is a schematic view for explaining the operation of a GTO at a turn-off period.

The above-mentioned experimental results suggest that the inner current and terminal current of the GTO flow as shown in FIG. 8, at the tail period. In FIG. 8, reference symbol $i_{av}$ designates an avalanche current flowing between the gate and cathode, $i_{Gnet}$ a net gate current drawn out from a local current concentration region, and $i_{Knet}$ a net cathode current flowing from the local current concentration region to the cathode terminal. Using these currents $i_{av}$, $i_{Gnet}$ and $i_{Knet}$, currents $i_K$, $i_G$ and $i_A$ at the terminals 5, 6 and 7 are given as follows:

$$i_K = i_{Knet} - i_{av} \quad (1)$$

$$i_G = i_{Gnet} + i_{av} \quad (2)$$

$$i_A = i_K + i_G = i_{Knet} + i_{Gnet} \quad (3)$$

As is evident from the equation (1), even when the net cathode current $i_{Knet}$ has a positive value, that is, the $J_3$ junction is not put in the reverse recovery state, the apparent cathode current $i_K$ can take a negative value and therefore the GTO can seem to have gone into the reverse recovery state, if the avalanche current $i_{av}$ is larger than the net cathode current $i_{Knet}$. In order to turn off the GTO in the real sense of the word, the net cathode current $i_{Knet}$ is required to have a negative value. That is, as can be seen from the equation (3), it is required to satisfy the following formula:

$$i_{Gnet} > i_A \quad (4)$$

The broken-line portion of the cathode current $i_K$ shown in FIG. 7 indicates the case where the above formula (4) is not satisfied.

Next, the anode current $i_A$ and net drawn-out gate current $i_{Gnet}$ at the tail period will be explained below. Since the resistance between the anode and cathode of the GTO takes a constant, high value at the tail period, the anode current $i_A$ increases with the supply voltage $V_D$. While, the net, drawn-out gate current $i_{Gnet}$ is determined by the gate-cathode voltage $v_{GK}$ and a conductance between the gate terminal and the current concentration region (hereinafter referred to as "gate draw-out conductance" and expressed by $G_g$), and is independent of the supply voltage $V_D$. The gate-cathode voltage $v_{GK}$ is equal to the avalanche voltage $V_{av}$ formed between the gate and cathode, at a period between the time $t_3$ and time $t_4$, and is equal to the supply voltage $V_R$ of the gate power source at a period after the time $t_4$. When the supply voltage $V_D$ is gradually increased while keeping constant a constant ON current which is to be cut off, the anode current $i_A$ first increases with the supply voltage $V_D$, and then increases abruptly since the avalanche current of the $J_2$ junction is added to the anode current. While, the net, drawn-out gate current $i_{Gnet}$ does not depend upon the supply voltage $V_D$, but is kept constant. Accordingly, the formula (4) is no longer satisfied at a specified voltage, which is a critical voltage.

It has been known from the above explanation that the limit of SOA, that is, a critical voltage exists for a GTO. Next, it will be explained how the critical voltage can be improved. In view of the above-mentioned mechanism for producing the limit of SOA, it can be considered to increase the critical voltage by reducing the avalanche current of the $J_2$ junction and by making the net, drawn-out gate current $i_{Gnet}$ large at the tail period.

In the GTO of FIG. 4 according to the present invention, the local conductive region at the final stage of turn-off action is limited (biased) to one side in the direction of the width of the n-emitter region $1d$, i.e. a side edge portion of the region $1d$. Further, the side edge portion of the n-emitter region viewed in the direction of the width rhereof, has a 30 to 40 percent smaller current density than that of a central portion of the n-emitter region, in the stationary state. That is, the edge portion of the emitter region is smaller in carrier density than the central portion. Accordingly, the local conductive region at the final stage of turn-off action is formed in the portion having a smaller carrier density, as compared with a conventional GTO. Therefore, the intensity of the electric field is decreased, and the avalanche effect of the $J_2$ junction is reduced. However, even when the avalanche effect of the $J_2$ junction is reduced as mentioned above, if the net, drawn-out gate current $i_{Gnet}$ is small, as is evident from the formula (4), it is impossible to sufficiently increase the critical voltage. In order to solve this problem, the GTO shown in FIG. 4 has the gate electrode $3b$ which is connected to the gate electrode $3a$ through the inter-gate resistance $R_{gg}$.

In the conventional GTO shown in FIG. 1, the local conductive region is formed in that portion of the p-base layer which corresponds to a central portion of the n-emitter layer $1d$ viewed in the direction of the width thereof, since carriers have been drawnout equally from both sides of the n-emitter layer viewed in the direction of the width thereof. Accordingly, the local conductive region is formed at a place which is farthest from the gate electrodes 3. While, in the GTO of FIG. 4 according to the present invention, the local conductive region is limited to one side of the n-emitter layer $1d$ in the direction of the width thereof, and therefore a resistance $r_2$ between the conductive region and gate electrode $3b$ is far smaller than a resistance $r_1$ between the conductive region and gate electrode $3a$. Further, that resistance between the gate electrode $3a$ and gate electrode $3b$, which is connected in series with the $r_2$, is the parallel combination of the inter-gate resistance $R_{gg}$ shown in FIG. 5 and the recovering resistance $r_3$ of the recovered portion of the p-base layer $1c$ which exists beneath the n-emitter region $1d$. Thus, the resultant resistance $r_0$ of the resistances $r_2$, $r_3$ and $R_{gg}$ has a small value. Accordingly, the net gate current $i_{Gnet}$ drawn out from the local conductive region is larger, as compared with that obtained in the conventional GTO of FIG. 1.

As mentioned above, in the GTO according to the present invention, the local conductive region at the final stage of turn-off action is formed in a portion having a smaller carrier density, as compared with the conventional GTO, to reduce the avalanche effect of the $J_2$ junction, and moreover the net, drawn-out gate current $i_{Gnet}$ is made large. Thus, the GTO is high in critical voltage and wide in SOA.

Further, the GTO according to the present invention has a low ON-voltage. That is, the GTO does not include means for reducing the effective area of the strip-shaped region $1d$ such as described in the previously-referred Japanese Patent Application Specification (Publication No. 28750/1968), and therefore the ON voltage in the conductive state is low. As the ON voltage in the conductive state is larger, the heat loss at the semiconductor substrate is increased, the possibility of thermal destruction is increased, and it becomes difficult to perform a turn-off operation. Therefore, the GTO according to the present invention is very large in current cut-off capability.

Further, the GTO according to the present invention is not required to have a complicated manufacturing process for reducing the effective area of the n-emitter layer 1d such as described in the previously-referred Japanese Patent Application (Laid-open No. 78172/1982).

Figure 9A:
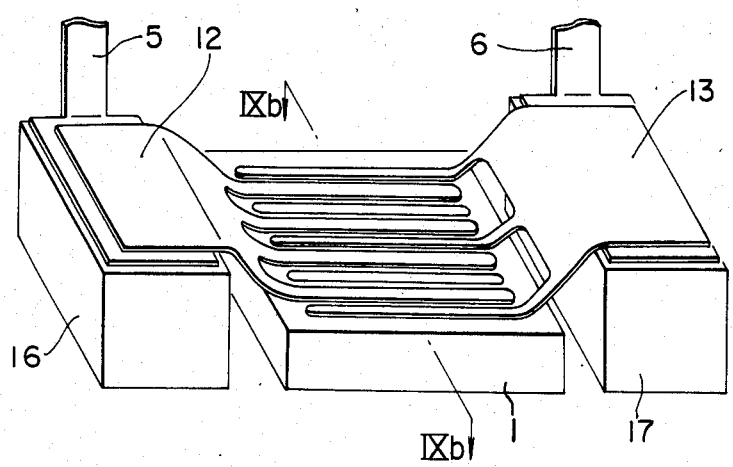
FIG. 9a is a schematic perspective view showing an embodiment of a GTO according to the present invention.
Figure 9B:
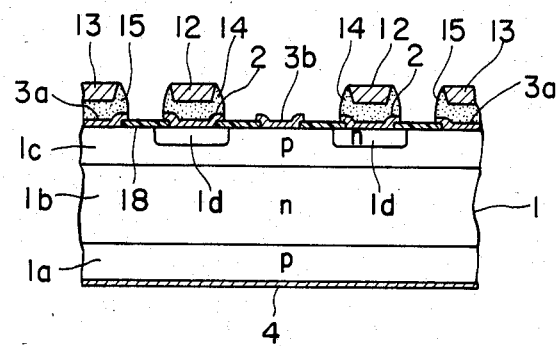

FIGS. 9a and 9b show an embodiment of a GTO according to the present invention. In FIGS. 9a and 9b, the same reference numerals as in FIGS. 4 and 5 designate identical or equivalent parts. Referring to FIGS. 9a and 9b, the silicon substrate 1 is formed of four layers, that is, the p-emitter layer 1a, n-base layer 1b, p-base layer 1c and n-emitter layer 1d. The n-emitter layer 1d is divided into a plurality of strip-shaped regions, and each strip-shaped n-emitter region 1d is provided thereon with the cathode electrode 2. The p-base layer 1c is provided thereon with the gate electrodes 3b and 3a which are arranged on one and the other sides of each strip-shaped n-emitter region 1d, respectively. The cathode electrodes 2 are connected with a comb-shaped conductor 12 through solder 14, and the gate electrodes 3a are connected with a comb-shaped conductor 13 through solder 15. The p-emitter layer 1a is provided thereon with the anode electrode 4, and the silicon substrate 1 is mounted on a base (not shown) in such a manner that the anode electrode 4 is fixed to the base. The cathode terminal 5 and gate terminal 6 are fixed to the base through insulators 16 and 17. The bridge or common connection portions of the comb-shaped conductors 12 and 13 are connected with the terminals 5 and 6, respectively. Incidentally, reference numeral 18 designates a surface passivation film (for example, a silicon oxide film) provided on the silicon substrate 1. In the present embodiment, each of the cathode electrodes 2 is disposed in the form of a tooth or an island, and kept in ohmic contact with the n-emitter region 1d. Further, each of the gate electrodes 3a or 3b is disposed in the form of a tooth or an island, and kept in ohmic contact with the common p-base layer 1c.

Figure 10:
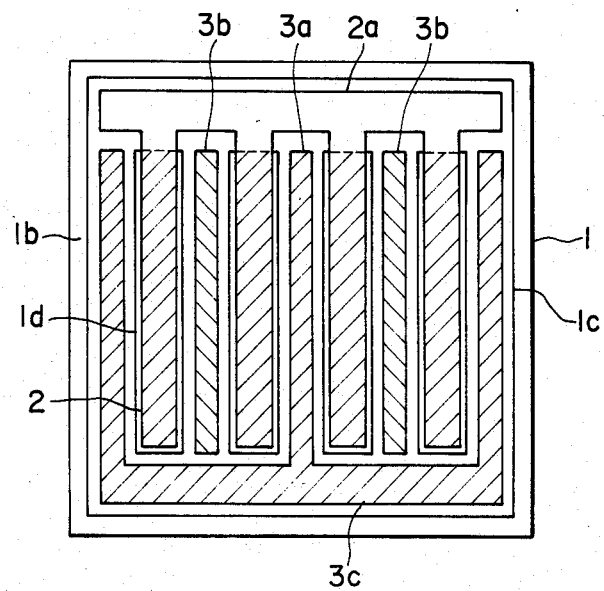
FIG. 10 is a plan view showing the cathode side of another embodiment of a GTO according to the present invention.

In another embodiment shown in FIG. 10, a bridge portion 2a for bridging the cathode electrodes 2 and another bridge portion 3c for bridging the gate electrodes 3a are provided on facing end portions of a principal surface of the silicon substrate 1, in order to make the embodiment suitable for wire bonding. FIG. 10 is a plan view of another embodiment of a GTO according to the present invention, viewed from the cathode side thereof. Hatched portions in FIG. 10 indicate areas where the cathode electrode 2 and gate electrode 3a or 3b are kept in contact with the n-emitter regions 1d and p-base layer 1c, respectively. The bridge portion 2a for the cathode electrodes 2 is formed on the surface passivation film (not shown) which is provided on the p-base layer 1c, to prevent the bridge portion 2a from being kept in direct contact with the p-base layer 1c. Further, the n-base layer 1b is exposed to the above-mentioned principal surface at a peripheral portion thereof, surrounding each n-emitter region 1d.

Figure 11:
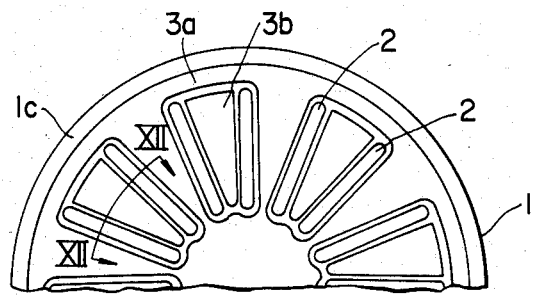
FIG. 11 is a plan view showing the cathode side of a further embodiment of a GTO according to the present invention.

The present invention is not limited to a semiconductor substrate having the form of a square such as shown in the above-mentioned embodiments, but is applicable to a circular semiconductor substrate shown in FIG. 11. In FIG. 11, the same reference numerals as in FIGS. 4 and 5 designate identical or equivalent parts.

In the circular semiconductor substrate 1 shown in FIG. 11, a plurality of strip-shaped n-emitter regions 1d are provided in radial directions, and the cathode electrodes 2 are provided on the strip-shaped regions in radial directions so as to be kept in ohmic contact with the strip-shaped regions and to be independent of each other. Further, a plurality of pairs of strip-shaped regions are selected, each of the gate electrodes 3b is kept in ohmic contact with the p-base layer 1c between a pair of strip-shaped regions, and the gate electrode 3a is kept in ohmic contact with the p-base layer 1c in such a manner that each pair of strip-shaped regions is surrounded by the gate electrode 3. In FIG. 11, the strip-shaped n-emitter region 1d is not shown for the sake of brevity.

In the semiconductor substrate shown in FIG. 11, the strip-shaped regions are radially arranged in one circle. However, it is desirable to radially arrange the strip-shaped regions in multiple circular shape in a semiconductor substrate which is required to have a high rated current.

Figure 12:
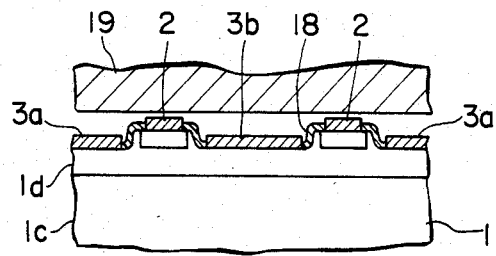
FIG. 12 is a sectional view taken along the line XII—XII of FIG. 11.

FIG. 12 shows a further embodiment of a GTO according to the present invention, in which the p-base layer 1c of the semiconductor substrate shown in FIG. 11 has an etched-down structure. That is, as is apparent from FIG. 12, the gate electrodes 3a and 3b are surely insulated from a cathode plate 19 when the cathode plate 19 is pressed against all the cathode electrodes 2.

Figure 13A:
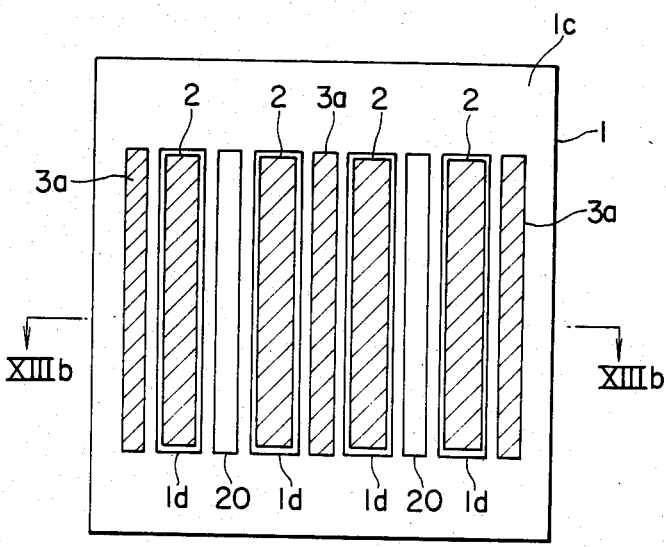
FIG. 13a is a plan view showing the cathode side of a different embodiment of a GTO according to the present invention.
Figure 13B:
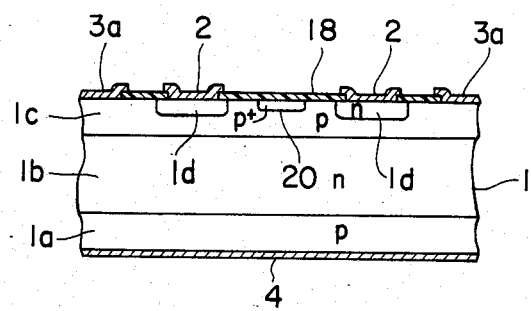

FIGS. 13a and 13b show a different embodiment which includes an alternative of the gate electrode 3b. That is, a highly-doped p-type layer 20 is formed in the p-base layer 1c. The highly-doped layer 20 is far smaller in resistivity than the p-base layer 1c, and therefore can play the role of the gate electrode 3b. In the present embodiment, the n-base layer 1b is not exposed to the cathode side of the semiconductor substrate.

Figure 14:
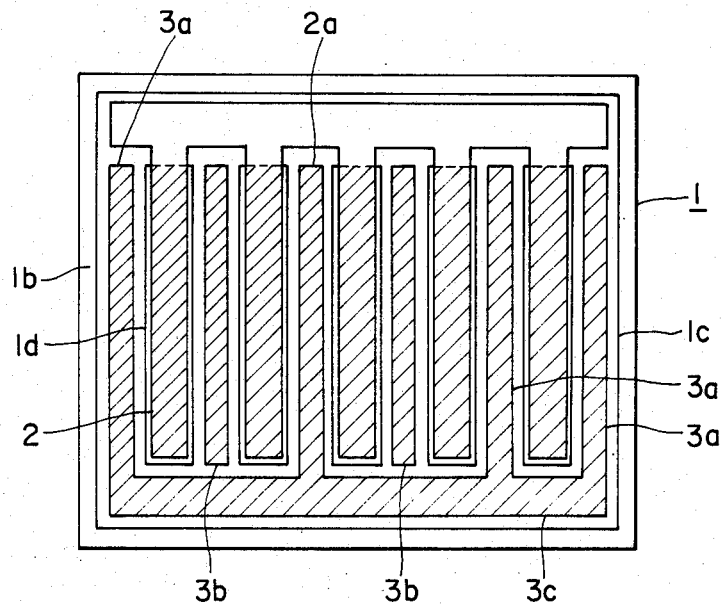
FIG. 14 is a plan view showing the cathode side of still another embodiment of a GTO according to the present invention.

FIG. 14 shows still another embodiment of a GTO according to the present invention, in which a conventional unit GTO structure and a unit GTO structure according to the present invention are juxtaposed. In FIG. 14, the same reference numerals as in FIGS. 4 and 5 designate identical or equivalent parts. Referring to FIG. 14, five n-emitter strip-shaped regions 1d are juxtaposed, and the strip-shaped region 1d at the right end is sandwiched, in the direction of the width thereof, between a pair of gate electrodes 3a which are connected with the bridge portion 3c such as shown in FIG. 10. Further, each of the remaining strip-shaped regions 1d is similarly sandwiched, in the direction of the width thereof, between the gate electrode 3a and gate electrode 3b as shown in FIG. 4, in order to alter the balance of current drawing ability between one and the other sides of the each strip-shaped region viewed in the direction of the width thereof. In the unit GTO structure which includes the strip-shaped region placed at the right end, carriers are drawn out from the previously-mentioned conductive region equally on both sides of the strip-shaped region viewed in the direction of the width thereof, at the initial stage of turn-off action. That is, the turn-off current is larger, as compared with the remaining unit GTO structures. Accordingly, the unit GTO structure at the right end tends to be turned off faster than the remaining units. At this time, the remaining unit GTO structures are still kept at the conductive state. Therefore, a current flowing through the unit GTO structure which includes the strip-shaped region placed at the right end, is readily transferred to the remaining unit GTO structures, and thus the unit GTO structure at the right end is rapidly turned off. Thereafter, the remaining unit GTO structures are turned off. As mentioned above, the current flowing through the unit GTO structure which is placed at the right end, is shared among the remaining unit GTO structures. Accordingly, the structure shown in FIG. 14 is formed when there are ample margins in SOA.

Figure 15:
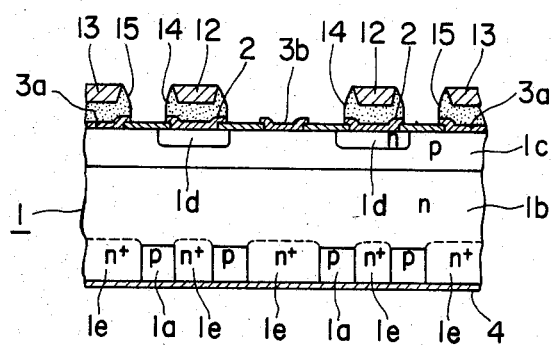
FIG. 15 is a fragmentary vertical sectional view showing in detail the silicon substrate of a modified version of the embodiment shown in FIG. 9b.

FIG. 15 shows a modified version of the embodiment shown in FIG. 9b. In the embodiment shown in FIG. 15, the p-emitter layer is provided not in the whole of the lower principal surface of the silicon substrate 1 but in some portions of the lower principal surface. In more detail, a plurality of p-emitter regions or pairs of regions 1a each having the form of an elliptical ring or opposing strips are provided in the lower principal surface so that the p-emitter region 1a is disposed along the contour of a projection of each n-emitter region 1d, which is obtained by projecting each n-emitter layer 1d orthogonally on the lower principal surface. It is seen that the p-emitter region 1a extends beyond the edge of the n-emitter region 1d toward the gate electrode 3a or 3b. The remaining portion of the lower principal surface is occupied by a highly-doped region 1e of the n-base layer 1b. The anode electrode 4 is provided on the lower principal surface, and is kept in ohmic contact with the p-emitter layers 1a and highly-doped n-type region 1e. Such a shorted p-emitter structure is also applicable to other embodiments.

Figure 16:
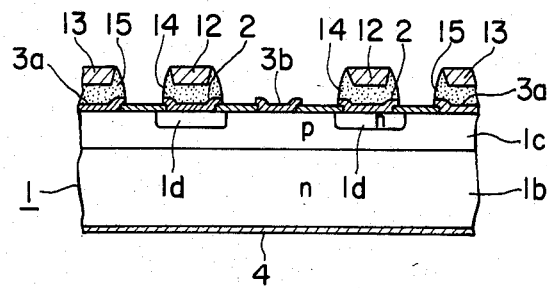
FIG. 16 is a fragmentary vertical sectional view showing another modified version of the embodiment shown in FIG. 9b, that is, a TRS according to the present invention.

FIG. 16 shows another modified version of the embodiment shown in FIG. 9b, that is, a transistor element according to an embodiment of the present invention. The transistor element is formed of a silicon substrate 1 which has a three-layer structure; an n-collector layer 1b, p-base layer 1c and an n-emitter layer 1d. A collector electrode 4 is kept in ohmic contact with the n-collector layer 1b. The n-emitter layer 1d has the form of strip-shaped regions. The gate electrode 3a is connected to the gate terminal 6 through the solder 15 and conductor 13. The gate electrode 3a and the floating gate electrode 3b are disposed on one and the other sides of the n-emitter region 1d on the upper surface.

Figure 17:
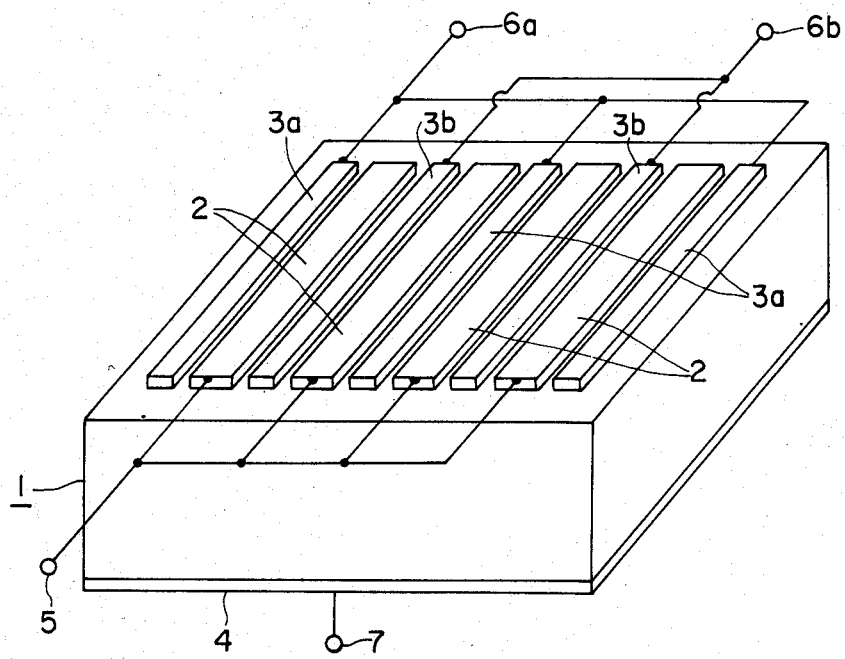
FIG. 17 is a schematic view showing an additional embodiment of a GTO according to the present invention.

FIG. 17 shows an additional embodiment of a GTO according to the present invention. The embodiment shown in FIG. 17 is different from the embodiment shown in FIG. 4 in that a plurality of gate electrodes 3b are connected with an external gate terminal 6b, and the gate terminal 6 is divided into gate terminals 6a and 6b. The gate terminal 6a serves as a main gate, and the gate terminal 6b serves as an auxiliary gate. Only the main gate is driven at the initial stage of turn-off action, and both of the main and auxiliary gates are driven at the final stage of turn-off action. In the present embodiment, a switch is connected between the gate terminals 6a and 6b, to be closed at the final stage of turn-off action. According to the present embodiment, the value of the previously-mentioned resistance $R_B$ at the final stage of turn-off action can be made smaller, as compared with the embodiment shown in FIG. 4. That is, the turn-off action proceeds remarkably on the gate electrode (3b) side at the above stage, and thus the SOA can be made wider.

As has been explained in the foregoing, according to the present invention, at the initial stage of turn-off action, carriers are drawn out from a conductive region unequally on both sides of a strip-shaped emitter region viewed in the direction of the width thereof. Thus, a semiconductor device can be obtained which has a wide SOA and a low ON-voltage.

We claim:

1. A semiconductor device comprising:
a semiconductor substrate having at least three semiconductor layers, adjacent ones of said semiconductor layers being different in conductivity type from each other, a first one of said semiconductor layers being formed of at least one strip-shaped region, a second one of said semiconductor layers being exposed to a first principal surface of said semiconductor substrate together with said first semiconductor layer in such a manner that said first semiconductor layer is surrounded by said second semiconductor layer;
a first and a second external terminal coupled to said semiconductor substrate for allowing a main current to flow through said semiconductor device when said first and second external terminals are coupled respectively to predetermined power supplies;
a first main electrode kept in ohmic contact with said strip-shaped region and connected to said first external terminal;
a second main electrode kept in ohmic contact with a semiconductor layer and connected to said second external terminal, said semiconductor layer being exposed to a second principal surface of said semiconductor substrate;
a control electrode having a first control electrode portion and a second control electrode portion, said first and second control electrode portions being disposed along the lengthwise direction of said strip-shaped region and kept in ohmic contact with said second semiconductor layer, on one and the other sides of said strip-shaped region viewed in the direction of the width of said strip-shaped region, respectively;
a control terminal connected directly to said second control electrode portion for providing a control signal to control the main current flow through said device; and
turn-off control means for drawing out current during a final stage of turn-off of the main current flow through said device comprising said first control electrode portion making exclusive ohmic contact to the second semiconductor layer, being free of all direct connections to external or internal points, and being exclusively coupled through the resistance of the second semiconductor layer to the control terminal of the second control electrode portion.

2. A semiconductor device comprising:
a semiconductor substrate having at least three semiconductor layers, adjacent ones of said semiconductor layers being different in conductivity type from each other, a first one of said semiconductor layers being formed of at least one strip-shaped regions, a second one of said semiconductor layers being exposed to a first principal surface of said semiconductor substrate together with said strip-shaped region in such a manner that said strip-shaped region is surrounded by said second semiconductor layer, a highly-doped region of the same conductivity type as said second semiconductor layer being formed in said second semiconductor layer along the lengthwise direction of said strip-shaped region, on one side of said strip-shaped region viewed in the direction of the width of said strip-shaped region;
a first and a second external terminal coupled to said semiconductor substrate for allowing a main current to flow through said semiconductor device when said first and second external terminals are coupled respectively to predetermined power supplies;

a first main electrode kept in ohmic contact with said strip-shaped region and connected to said first external terminal;

a second main electrode kept in ohmic contact with a semiconductor layer and connected to said second external terminal, said semiconductor layer being exposed to a second principal surface of said semiconductor substrate;

a control terminal for applying a control signal to control the main current flow through the device;

a control electrode kept in ohmic contact with said second semiconductor layer along the lengthwise direction of said strip-shaped region, on the other side of said strip-shaped region viewed in the direction of the width of said strip-shaped region, said control electrode being connected to said control terminal; and turn-off control means for drawing out current during a final stage of turn-off of the main current flow through the device, comprising the highly-doped region making exclusive contact with said second semiconductor layer, being free of all direct connections to any external or internal points, and being exclusively coupled through the resistance of the second semiconductor layer to the control terminal of the control electrode.

3. A semiconductor device according to claim 1 or 2, wherein said semiconductor substrate has four semiconductor layers, a fourth one of said semiconductor layers is exposed to said second principal surface of said semiconductor substrate, and said second main electrode is kept in ohmic contact with said fourth semiconductor layer.

4. A semiconductor device according to claim 1 or 2, wherein said semiconductor substrate has four semiconductor layers, third and fourth ones of said semiconductor layers are exposed to said second principal surface of said semiconductor substrate, and said second main electrode is kept in ohmic contact with said third and fourth semiconductor layers.

5. A high power, large current, vertical semiconductor device formed in a semiconductor substrate having a first and a second parallel principal surface, the semiconductor substrate including a first base region of one conductivity type exposed to the first principal surface, a first emitter region of the other conductivity type opposite to said one conductivity type diffused in the first base region from the first principal surface, surrounded by the first base region in the first principal surface, comprising:

a first control electrode disposed on said first base region adjacent to one side of said first emitter region at the first principal surface;

a second control electrode disposed on said first base region adjacent to another side of said first emitter region at the first principal surface, and physically separated from said first control electrode and electrically connected thereto through a resistance in said first base region;

a control terminal electrically connected directly to the first control electrode;

the resistance in said first base region being partly formed of the lateral resistance of a portion of the first base region beneath said first emitter region, whereby said lateral resistance is reduced as a current flowing through said first emitter region is reduced in magnitude and in area; and turn-off control means for drawing out current during a final stage of turn-off of said device comprising the second control electrode making exclusive contact with the first base region, being free of all direct connections to any external or internal points, and being exclusively coupled through the resistance of the second semiconductor layer to the control terminal of the first control electrode.

6. A semiconductor device according to claim 5, wherein said semiconductor substrate has four semiconductor layers, and a fourth one of said semiconductor layers is exposed to said second principal surface of said semiconductor substrate.

7. A semiconductor device according to claim 5, wherein said semiconductor substrate has four semiconductor layers, and third and fourth ones of said semiconductor layers are exposed to said second principal surface of said semiconductor substrate.

* * * * *